United States Patent
Miller et al.

(10) Patent No.: US 11,835,560 B2
(45) Date of Patent: Dec. 5, 2023

(54) ELECTROMAGNETIC SURVEYS WITH POWER TRANSMISSION LINES

(71) Applicant: X Development LLC, Mountain View, CA (US)

(72) Inventors: Alex S. Miller, Cambridge, MA (US); Artem Goncharuk, Mountain View, CA (US); Allen Richard Zhao, Mountain View, CA (US); Kevin Forsythe Smith, Pleasanton, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 18/160,651

(22) Filed: Jan. 27, 2023

(65) Prior Publication Data

US 2023/0243880 A1     Aug. 3, 2023

Related U.S. Application Data

(60) Provisional application No. 63/304,125, filed on Jan. 28, 2022.

(51) Int. Cl.
*H01H 31/02*     (2006.01)
*G01R 29/08*     (2006.01)
(Continued)

(52) U.S. Cl.
CPC ..... *G01R 29/0842* (2013.01); *G01R 1/06788* (2013.01); *G01R 27/28* (2013.01);
(Continued)

(58) Field of Classification Search
CPC ............... G01R 29/0842; G01R 27/28; G01R 29/0878; G01R 31/085; G01R 31/52;
(Continued)

(56) References Cited

U.S. PATENT DOCUMENTS 3,866,111 A     2/1975  Warren
7,053,622 B2   5/2006  Sorensen
(Continued)

OTHER PUBLICATIONS

Higgins et al., "Measurement and Modeling of the Indirect Coupling of Lightning Transients into the Sago Mine," IEEE Transactions on Electromagnetic Compatibility, Feb. 2010, 52(1):136-146.
(Continued)

*Primary Examiner* — Raul J Rios Russo
(74) *Attorney, Agent, or Firm* — Fish & Richardson P.C.

(57) ABSTRACT

This disclosure describes a system and method for generating images by performing TEM surveys using pre-existing infrastructure such as transmission lines, or power lines, and naturally occurring transients such as lightning strikes or load switching. A relatively inexpensive sensor array can be installed on overhead power lines (e.g., electrical transmission or sub-transmission lines) which can detect transients in the overhead power lines. Transients in the overhead power lines can cause the power lines to emit pulses of electromagnetic (EM) radiation, which propagate into the earth's subsurface. This sudden change in electromagnetic field in the subsurface can induce eddy currents, which in turn emit
(Continued)

return EM radiation that can propagate back to the overhead power line and induce secondary voltage and current transients. The magnitude of these secondary transients, and their time delay from the original transient are influenced by the properties of the subsurface in which the eddy currents formed.

26 Claims, 4 Drawing Sheets

(51) Int. Cl.
*G01R 27/28* (2006.01)
*G01R 31/08* (2020.01)
*G01R 31/52* (2020.01)
*G01R 31/58* (2020.01)
*G01R 1/067* (2006.01)
*H04M 1/24* (2006.01)
*H04M 3/28* (2006.01)
*H04M 3/30* (2006.01)

(52) U.S. Cl.
CPC ....... *G01R 29/0878* (2013.01); *G01R 31/085* (2013.01); *G01R 31/52* (2020.01); *G01R 31/58* (2020.01); *H04M 1/24* (2013.01); *H04M 3/28* (2013.01); *H04M 3/30* (2013.01)

(58) Field of Classification Search
CPC ...... G01R 31/58; G01R 1/06788; G01V 3/08; H04M 1/24; H04M 3/28; H04M 3/30
USPC .................................................. 324/500, 555
See application file for complete search history.

(56) References Cited

U.S. PATENT DOCUMENTS

| | | | |
|---|---|---|---|
| 7,239,145 B2 | 7/2007 | Homan et al. | |
| 7,248,052 B2 | 7/2007 | Weaver et al. | |
| 8,873,334 B2 | 10/2014 | Thompson et al. | |
| 9,798,034 B2 | 10/2017 | Cho et al. | |
| 2016/0216304 A1 | 7/2016 | Sekelsky | |
| 2017/0336453 A1* | 11/2017 | Flourens | H02G 13/60 |
| 2020/0110185 A1 | 4/2020 | Xu et al. | |
| 2020/0159211 A1 | 5/2020 | Johmori | |
| 2022/0349929 A1* | 11/2022 | Tews | G01R 29/085 |

OTHER PUBLICATIONS

International Search Report and Written Opinion in International Appln. No. PCT/US2023/011749, dated Apr. 25, 2023, 20 pages.
Sattel et al., "Passive EM Processing of MEGATEM and HELITEM Data," AEGC 2018: Sydney, Australia, Feb. 21, 2018, pp. 1-8.
Vallee et al., "Case History—Case history of combined airborne time-domain electromagnetics and power-line field survey in Chibougamau, Canada," Geophysics, Society of Exploration Geophysicists, Mar. 1, 2010, 75(2):B67-B72.

* cited by examiner

ELECTROMAGNETIC SURVEYS WITH POWER TRANSMISSION LINES

CROSS-REFERENCE TO RELATED APPLICATION

This application claims the benefit under 35 U.S.C. § 119(e) of U.S. Patent Application No. 63/304,125, entitled "Electromagnetic Surveys With Power Transmission Lines," filed Jan. 28, 2022, which is incorporated herein by reference in its entirety.

TECHNICAL FIELD

This disclosure generally relates to generating subsurface images using transmission lines as a source of energy.

BACKGROUND

Many methods for subsurface imaging currently exist, including gravitational sensing, transient electromagnetics (TEM), seismic, and fiber optic sensing. TEM surveys provide relatively large scale, low resolution imaging of the subsurface using the principles of Faraday's law of induction and Lenz's law.

SUMMARY

In general, the disclosure involves a system, non-transitory computer readable medium, and a method for generating a subsurface image by detecting a transient event in an electrical power line at two or more predetermined locations in the electrical power line, detecting an electrical signal induced in the power line at the two or more predetermined locations by a return electromagnetic signal generated by eddy currents induced in ten subsurface by ten transient event, and processing the detected electrical signal and transient event to generate a subsurface image.

Implementations can optionally include one or more of the following features.

In some implementations, the transient event is caused by a lightning strike, a transformer failure, a circuit breaker operation, or an electrical load being energized or de-energized.

In some implementations, the transient event and electrical signal are detected by sensors that are connected to the electrical power line at the two or more predetermined locations. In certain instances, the sensors can detect electrical parameters of the power line including voltage, current, time rate of change of voltage, and time rate of change of current. In certain implementations, there are additional sensors installed on a mobile platform.

In some implementations, processing the detected electrical signal and transient event includes providing the detected electrical signal and the detected transient event as input to a machine learning model to generate the subsurface image. Additionally, power line geometry and electrical topography can optionally be provided as additional input to the machine learning model.

In some implementations, the electrical power line is an above ground, single phase, AC, power transmission line.

In some implementations, the electrical power line is an underground, AC power transmission line.

The details of one or more implementations of the subject matter of this specification are set forth in the accompanying drawings and the description below. Other features, aspects, and advantages of the subject matter will become apparent from the description, the drawings, and the claims.

DESCRIPTION OF DRAWINGS

This disclosure relates to generating subsurface images of the subsurface using transients in transmission lines as source energy.

DETAILED DESCRIPTION

Figure 1:
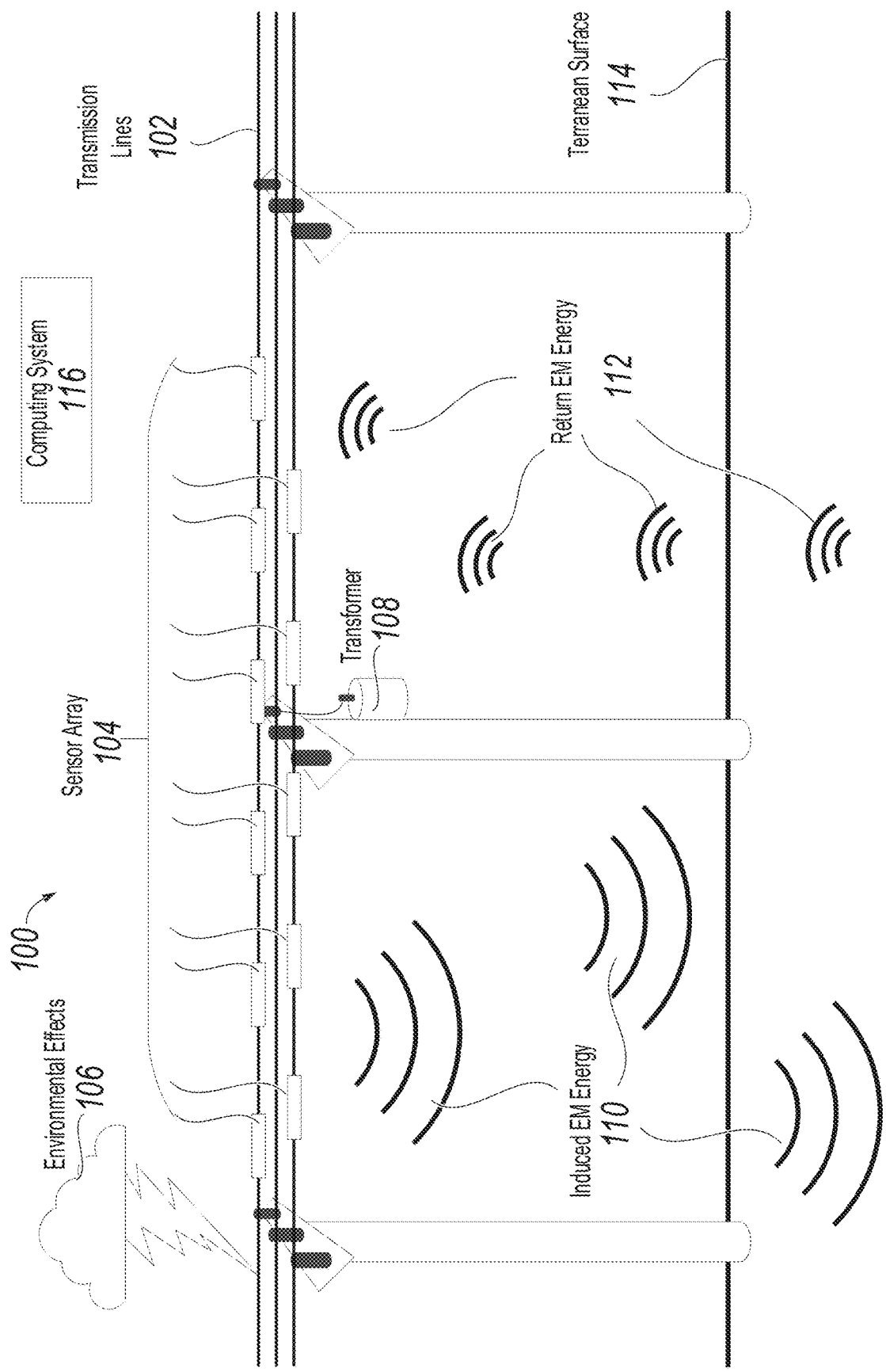
FIG. 1 is an example system architecture for generating subsurface images using transients in transmission lines as source energy.

This disclosure describes a system and method for generating subsurface images using transients in transmission lines as source energy. Traditionally transient electromagnetic (TEM) surveys involve an aerial platform (e.g., helicopter, or blimp) carrying a transmitter coil, receiver coils, instrumentation to determine the location of the transmitter and receiver coils, and electronics required to generate an impulse in the transmitter coil. The coil is relocated to perform TEM surveys over different regions of the earth. In addition to conventional TEM surveys requiring specialized, expensive equipment, they can only be conducted in areas that are accessible to that equipment. For example, it is difficult to perform a TEM survey using a helicopter over an urban or residential region where a low flying aircraft is not permitted to operate. This disclosure alleviates those shortcomings, achieving repeated surveys over time in a broad geographic area, without the need for expensive, and complex airborne TEM surveys. Further, because power lines are relatively close to the ground compared with airborne TEM operations, and transients can be relatively high power, the disclosed system is capable of detecting deeper subsurface features (e.g., deep basalts, or other deep stratigraphic features) that are not typically detectable using traditional airborne TEM. The detection of deep subsurface features can be advantageous in carbon capture and storage monitoring, water management, construction applications, or other industries.

This disclosure describes a system and method for performing TEM surveys using pre-existing infrastructure such as transmission lines, or power lines, and naturally occurring transients such as lightning strikes or load switching. In some implementations, artificially induced transients (e.g., intentional breaker operations or load switching) can be used as well. For example, artificially induced transients can be sent or induced in a pseudorandom pattern in a time domain. Further, loads can be switched to make a specific frequency response in a grid carrier frequency. Even further, teams can coordinate with, e.g., grid companies to use data from planned outages with exact timing data. In some aspects, changing these characteristics (and/or others) of these artificial transients can be favorable for higher system SNR. In some implementations, artificially induced transients include transients generated by a generator connected to the grid (e.g., a rapid frequency shift, or phase change). A relatively inexpensive sensor array can be installed on overhead power lines (e.g., electrical transmission or sub-transmission lines) which can detect transients in the overhead power lines. In some implementations, existing grid sensors can be used, or can augment data observed by the sensor array. Existing grid sensors can include, for example, substation sensors, transformers, home smart meters, or other sensors. Transients in the overhead power lines can cause the power lines to emit pulses of electromagnetic (EM) radiation, which propagate into the earth's subsurface. This sudden change in electromagnetic field in the subsurface can induce eddy currents, which in turn emit return EM radiation that can propagate back to the overhead power line and induce secondary voltage and current transients. The magnitude of these secondary transients, and their time delay from the original transient are influenced by the properties of the subsurface in which the eddy currents formed. In some implementations, a separate sensor array detects the secondary transients, and can be located remotely from the overhead power lines. In some implementations, this separate sensor array can be a mobile array. For example, it can be installed in a vehicle or aircraft. In other implementations, a single sensor array detects both the original transient, and the secondary transients induced by the subsurface eddy currents.

FIG. 1 illustrates an example system architecture for generating subsurface images using transients in transmission lines as source energy. The system architecture 100 includes transmission lines 102, which support a sensor array 104. One or more transformers 108 can draw power from the transmission lines 102, stepping down voltage for consumption by local users (e.g., residential buildings or businesses). Environmental effects 106 (e.g., lightning strikes) and normal grid operations (e.g., load switching, supply switching) can cause electrical transients in the transmission lines 102. While illustrated as a three-phase, linear transmission line, it should be noted that transmission lines 102 can be high voltage lines, single phase lines, and can form grids or have complex topologies. Additionally, more, or fewer phases are contemplated. For example, a single phase high voltage DC transmission line can be used as well as multi-phase medium voltage AC transmission lines, among others.

The sensor array 104 can be a plurality of sensors that are hardwired, or inductively coupled with the transmission lines 102. In some implementations, a single phase is sensed. In some implementations, multiple phases are sensed. Each sensor of the sensor array 104 can be at a predetermined location, both geographically, and in reference to the circuit topology of the transmission line. For example, geographic location can include latitude, longitude, altitude, and height above the terranean surface 114. Location in reference to circuit topology can refer to the sensor location relative to branches, nodes, sources, and sinks in the power transmission line. For example, a particular sensor can be located three branches downstream of a main distribution grid, on "sub-grid 33," and upstream of a set of ten medium voltage distribution transformers. Sensors (e.g., inline sensors) in the sensor array 104 can record line voltage, current, and the time rate of change of these parameters (e.g.

$$\frac{dV}{dt} \text{ and } \frac{dI}{dt}\bigg).$$

As another example, sensors (e.g., that are not inline) can measure voltage or current in an additional coil, corresponding to the electromagnetic fields in the vicinity of the cable.

In some implementations sensors also record additional parameters, such as ambient temperature, noise level, light level, humidity, or other environmental parameters. The sensors can store recorded data locally, and transmit the data to a remote location or a computing system 116 (e.g., cloud based server, or computer). In some implementations the sensors communicate wirelessly (e.g., using Wi-Fi, or cellular communications) to a base station (e.g., computing system 116), which records and analyzes data. In some implementations, each sensor in the sensor array 104 includes an accurate clock, which can synchronize with other clocks of the sensor array to within 0.1 µs. For example, each sensor can synchronize with a GPS signal or other signal. While illustrated as installed on two separate lines, a single line, or all available phases are contemplated for sensor array 104.

Additionally, while a single set of sensors are shown in sensor array 104, sensor array 104 can include multiple sets of sensors, with non-uniform spacing or positioning. For example, on a single transmission line, sensor array 104 could include a first set of three sensors spaced 50 meters apart each, followed by a second set, 10 kilometers further along the line, of three sensors spaced 25 meters apart each.

Transients in the transmission lines 102 can be induced by environmental effects 106 (e.g., a lightning strike) or operational effects (e.g., transformer 108 failing, or a new source being switched onto/off the grid). Transients (e.g., rapid changes in voltage or current in the line such as a 1000V spike with a 1 ms rise time and sufficiently high amperage, or a 10,000 A surge that lasts less than 10 µs) can generate induced EM energy 110 in the form of electromagnetic waves, or time varying magnetic fields, which can propagate from the transmission lines 102 into the terranean surface 114. As the EM energy 110 propagates through the subsurface, it dissipates, generating eddy currents at varying amplitudes based on the properties of the subsurface (e.g., ore content, density, water content, etc.). The eddy currents then transmit return EM energy 112, which propagates from the subsurface to the transmission lines 102 and can induce secondary transients in the transmission lines 102. These secondary transients are influenced by the subsurface, and can be detected by the sensor array 104 to generate imaging data associated with the subsurface. The induced EM energy 110 can include broadband EM energy (e.g., a multitude of frequencies). This energy disperses at varying rates according to frequency as the wavefront propagates away from its origin. This dispersion relationship can be helpful in determining the properties of the medium through which the induced EM energy 110 travels.

In some aspects, techniques of time-domain reflectometry with grid transients determine reflection and transmission coefficients in areas of the grid where there is an impedance mismatch. For instance, these determinations can be done with an artificial disturbance. Having these reflection and transmission coefficients can provide systems according to the present disclosure with heuristics to further understand propagation of transients. In some aspects, all or most of the data processing related to the grid transients can be performed in the time domain. Even such time domain techniques like comparing waveform shapes can allow for the identification of changes in the system. In data gathering systems with a relatively large sensor system, at certain time instances or periods, parts of the grid are disconnected (e.g., intentionally or due to a fault). In such time periods, it can be possible to obtain less noisy local dispersion relations, and smaller uncertainty on reflection and transmission coefficients across the interfaces in the system.

Figure 2:
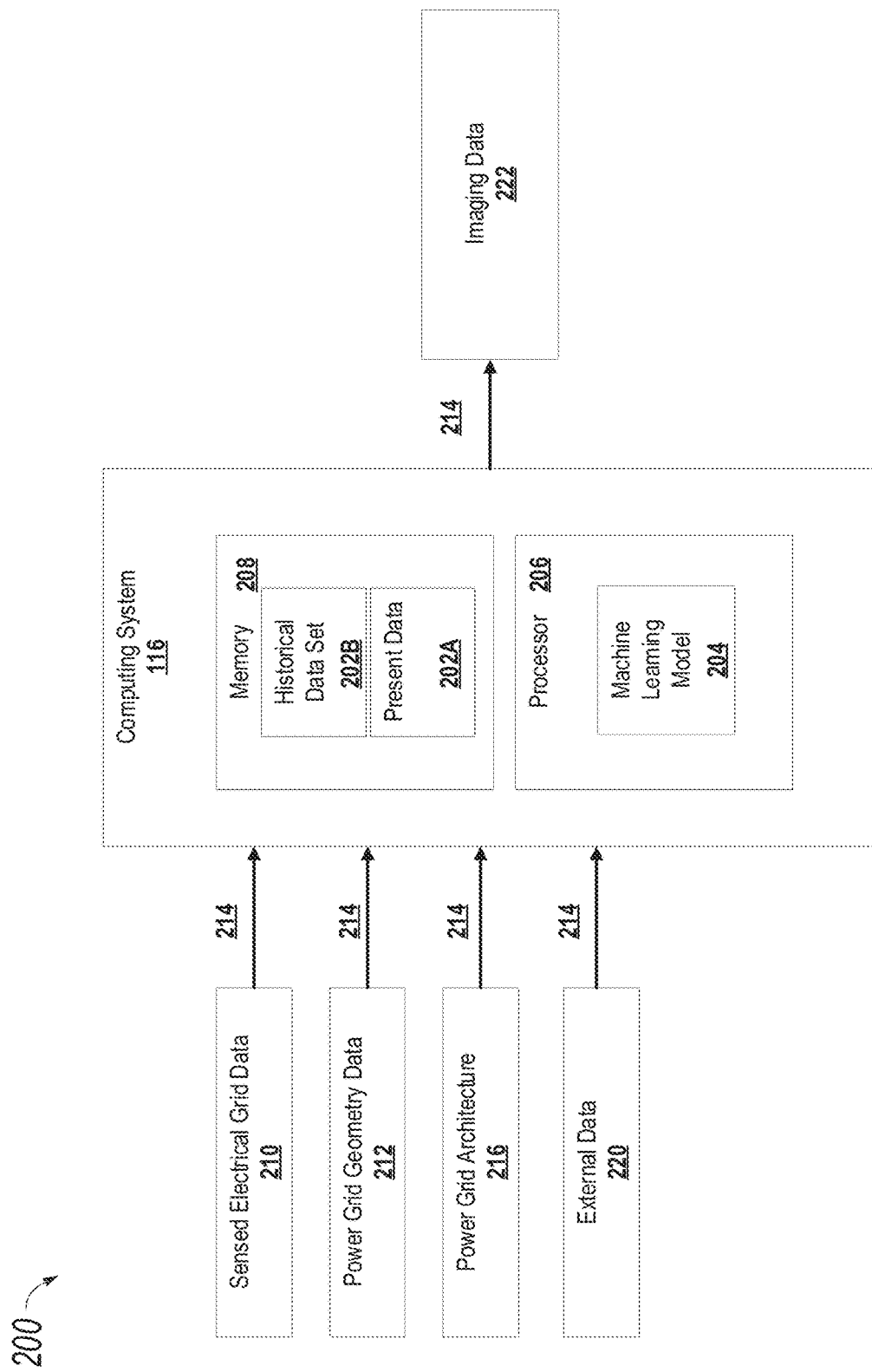
FIG. 2 is a block diagram of an example computing system for generating subsurface images based on received data.

FIG. 2 is a block diagram of an example computing system 200 for generating subsurface images based on received data. The computing system 116 can receive data from various systems (e.g., the sensor array 104 of FIG. 1) via a communications link 214. The communication interface 214 can be but is not limited to a wired communication interface (e.g., USB, Ethernet, fiber optic) or wireless communication interface (e.g., Bluetooth, ZigBee, WiFi, infrared (IR), CDMA2000, etc.). The communication interface 214 can be used to communicate directly or indirectly, e.g., through a network, with the computing system 116.

The computing system 116 receives present data 202A from various sources via the communications link 214. Present data 202A can be data included in the most recent readings taken from a sensor array 104. Present data 202A can include, but is not limited to sensed electrical grid data 210, which can include secondary transients induced by eddy currents in the subsurface and recorded by one or more receivers (e.g., sensor array 104 of FIG. 1), power grid geometry data 212, power grid architecture 216, external data 220, which can be recorded by an additional source, including weather data (e.g., temperature, humidity, sunlight, etc.) and other imaging data sources such as a ground penetrating radar, or other subsurface imaging device being used in conjunction with the systems described herein. In some implementations, the present data 202A can be received in real-time. The present data 202A is then used by the machine learning model 204 operating with a processor 206 to generate a quantified output.

Sensed electrical grid data 210 includes voltage, current, time rate of change of voltage and current (e.g., $$\frac{dV}{dt} \text{ and } \frac{dI}{dt})$$

and other measurements from the power lines. These parameters can be sensed by an array of sensors that are in a known location (e.g., sensor array 104 of FIG. 1). Sensed electrical grid data 210 can include transients induced by lightning strikes, grid operations (e.g., load switching or source switching), or other events (e.g., transformer failure, or an intentionally induced event for the purposes of performing TEM). Sensed electrical grid data 210 can additionally include secondary transients, induced by return EM energy from the subsurface. This return EM energy is influenced by the properties of the subsurface. In some implementations, the sensed electrical grid data 210 is preprocessed prior to being transmitted to the computing system 116. For example, the data can be filtered to isolate transients and secondary transients of interest. In some implementations, sensed electrical grid data 210 is filtered to look at particular frequencies of interest (e.g., frequencies greater than 100 KHz).

In some implementations, sensed electrical grid data 210 is enriched prior to being transmitted to the computing system 116. For example, the sensed electrical grid data 210 can be tagged with location and timing information, as well as specific features of the data can be tagged (e.g., transients, time and location of transient, secondary transients, etc.). Additionally transient information can be characterized during preprocessing. For example, a determination of direction of propagation, and how the transient changes as it propagates within the sensors (e.g., sensor array 104) can be determined. Further analysis can be performed to determine, for example, an estimated origin point and time of the transient, as well as estimated transient type. Other preprocessing algorithms can also be used. For example, data compression, edge detection, or other algorithms can occur prior to the sensed electrical grid data 210 reaching the computing system 116.

Power grid geometry data 212 can include data associated with the physical location of lines of the power grid. Power grid geometry data 212 can include, but is not limited to, the longitude and latitude of each line, as well as its respective height above the ground, and altitude relative to sea level. Additionally power grid geometry data 212 can include information regarding nearby structures (e.g., antennas or buildings located near the power line).

Power grid architectures 216 can include data associated with the circuit topology of the power grid. Power grid architecture 216 describes where connections are made, and what in the circuit that forms the power grid. This data can include the number and connection points of substations, loads, and sources in the power grid. The power grid architecture 216 can include a mapping function that describes a relationship between the circuit topology of the grid and the physical geometry of the grid. A bi-directional mapping function, or two unidirectional mapping functions can describe these relationships.

External data 220 includes data that is not directly related to the power grid. For example, external data 220 can include weather data (e.g., temperature, humidity, precipitation, solar irradiance, etc.) as well as time, other data (e.g., scheduled grid maintenance or operations), or construction data or other data related to the subsurface in the region being sensed. In some implementations external data 220 includes subsurface images from additional sources (e.g., ground penetrating radar, or gravimetric sensors) which can be used by the machine learning model 204.

The computing system 116 can store a historical data set 202B in memory 208. The historical data set can include all data that has previously been used in a particular region, or a subset of the previous data. The historical data set 202B can also include data relating to common trends seen across multiple regions or locations, or trends seen among particular locations or regions or any suitable combination thereof.

The machine learning model 204 receives the present data 202A, and the historical data 202B and generates a quantified output. For example, the machine learning model 204 can compare the sensed electrical grid data 210 with the external data 220, power grid geometry data 212 and power grid architecture 216 to generate imaging data 222. Imaging data 222 can represent information regarding the subsurface based on its influence on the secondary transients detected in the sensed electrical grid data 210, without the need to use an aerial vehicle and perform a TEM survey. In some implementations, the imaging data 222 can include location, form, material, and contents of a target subsurface region.

In some implementations, a conventional algorithm, or stack of algorithms is used to process the present data 202A and historical data 202B prior to processing by the machine learning model 204 or to produce imaging data 222 directly. Conventional algorithms can include, for example, image inversion, de-noising, fast Fourier transforms, finite impulse response filters, infinite impulse response filters, Kalman filters, or other algorithms.

In some implementations, the machine learning model 204 is a deep learning model that employs multiple layers of models to generate an output for a received input. A deep neural network is a deep machine learning model that includes an output layer and one or more hidden layers that each apply a non-linear transformation to a received input to generate an output. In some cases, the neural network may be a recurrent neural network. A recurrent neural network is a neural network that receives an input sequence and generates an output sequence from the input sequence.

In particular, a recurrent neural network uses some or all of the internal state of the network after processing a previous input in the input sequence to generate an output from the current input in the input sequence. In some other implementations, the machine learning model 204 is a convolutional neural network. In some implementations, the machine learning model 204 is an ensemble of models that may include all or a subset of the architectures described above.

In some implementations, the machine learning model 204 can be a feedforward auto-encoder neural network. For example, the machine learning model 204 can be a three-layer auto-encoder neural network. The machine learning model 204 may include an input layer, a hidden layer, and an output layer. In some implementations, the neural network has no recurrent connections between layers. Each layer of the neural network may be fully connected to the next, e.g., there may be no pruning between the layers. In some implementations, the machine learning model 204 can be a graph neural network (GNN) or other suitable network. The neural network may include an optimizer for training the network and computing updated layer weights, such as, but not limited to, ADAM, Adagrad, Adadelta, RMSprop, Stochastic Gradient Descent (SGD), or SGD with momentum. In some implementations, the neural network may apply a mathematical transformation, e.g., a convolutional transformation or factor analysis to input data prior to feeding the input data to the network.

In some implementations, the machine learning model 204 can be a supervised model. For example, for each input provided to the model during training, the machine learning model 204 can be instructed as to what the correct output should be. The machine learning model 204 can use batch training, e.g., training on a subset of examples before each adjustment, instead of the entire available set of examples. This may improve the efficiency of training the model and may improve the generalizability of the model. The machine learning model 204 may use folded cross-validation. For example, some fraction (e.g., the "fold") of the data available for training can be left out of training and used in a later testing phase to confirm how well the model generalizes. In some implementations, the machine learning model 204 may be an unsupervised model. For example, the model may adjust itself based on mathematical distances between examples rather than based on feedback on its performance.

The machine learning model 204 can be, for example, a deep-learning neural network or a "very" deep learning neural network. For example, the machine learning model 204 can be a convolutional neural network. The machine learning model 204 can be a recurrent network. The machine learning model 204 can have residual connections or dense connections. The machine learning model 204 can be an ensemble of all or a subset of these architectures. The model may be trained in a supervised or unsupervised manner. In some examples, the model may be trained in an adversarial manner. In some examples, the model may be trained using multiple objectives, loss functions or tasks.

In some implementations, the machine learning model 204 can generate imaging data 222 based on recorded data only. In other words, the imaging data 222 can be a new image, based on no prior collections. In some implementations, the machine learning model 204 can use sensed electrical grid data 210 to improve a previously existing subsurface image or survey that was acquired by other means (e.g., ground penetrating radar, seismic survey data, or other information about the subsurface). For example, a gravimetric survey can be enriched to include increased information, or better detail at certain depths, based on additional data received at the machine learning model 204 in order to create imaging data 222.

In some implementations, the machine learning model 204 can provide suggested additional data that could further improve the output of the machine learning model 204. For example, the machine learning model 204 could provide analysis of the transients and suggested sensor array arrangements to enhance future imaging data 222. In another example, the machine learning model 204 could provide recommended locations for receivers (e.g., sensor array 104 of FIG. 1) to record future transients and secondary transients.

Figure 3:
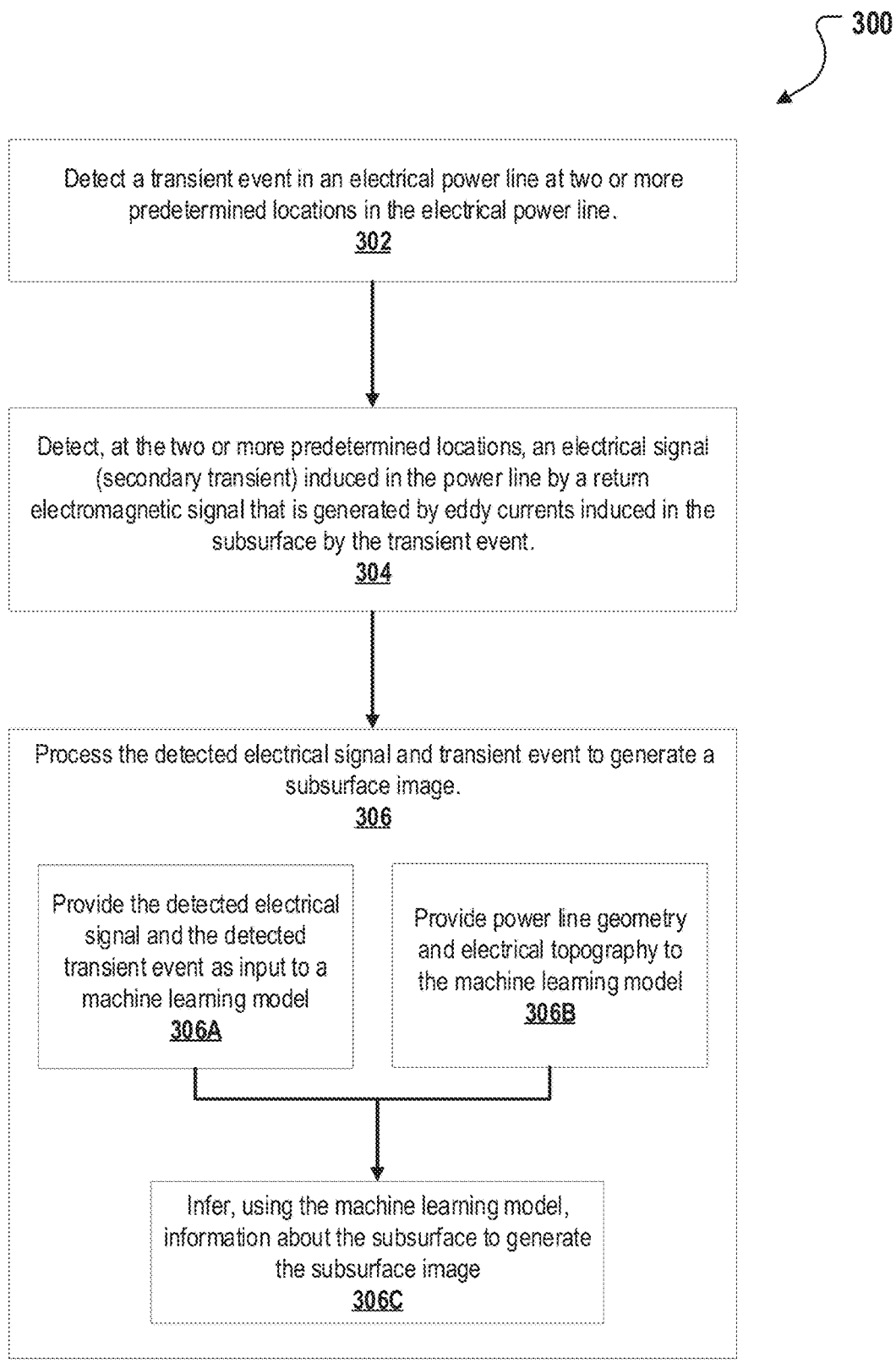
FIG. 3 is a flowchart describing an example method for generating a subsurface image.

FIG. 3 is a flowchart describing an example method for generating a subsurface image. In some implementations, the example process 300 may be performed using one or more computer-executable programs executed using one or more computing devices.

At 302, a transient event is detected in an electrical power line at two or more predetermined locations in the electrical power line. The transient event can be, for example, a lightning strike, a transformer failure, or one or more breaker operations (e.g., closing, tripping, or opening) that result in a change in load or supply to the power line. A sensor, or array of sensors can detect the current and voltage in the power line during the transient, and record or relay that information to a computing system for further processing. The predetermined location can be a physical location (e.g., latitude and longitude) as well as location with reference to the electrical topology of the power grid (e.g., wireline distance from various connections, nodes, and switches).

At 304, an electrical signal induced in the power line by a return electromagnetic signal that is generated by eddy currents induced in the subsurface by the transient event is detected at the two or more predetermined locations. The electric signal, which can be referred to as a secondary transient, is influenced by the properties of the subsurface from which it originated. Secondary transients can be recorded by the same sensors, or different sensors as those that recorded the transient event.

At 306, the detected electrical signal and the transient event are processed to generate a subsurface image. The subsurface image can be an image detailing one or more properties of the subsurface in a detection region based on the sensor array location. The subsurface image can include a resistivity mapping of the subsurface as a function of space and time. For example, a mapping can be provided for a region showing resistivity over time of that region at various locations. Resistivity can then be used (e.g., by a ML model as described above) to determine mineral composition or other parameters associated with the subsurface (e.g., mineral type, rock type, soil type, the presence of void, etc.). Resistivity can further be used to determine water content, or other parameters of the subsurface.

The processing can include providing the detected electrical signals and the detected transient event as input to a machine learning model (306A) as well as providing power line geometry and electrical topography or architecture to the machine learning model (306B). The machine learning model can then infer information from its received inputs, and generate the subsurface image. This processes can be similar to that described above with respect to FIG. 2.

Figure 4:
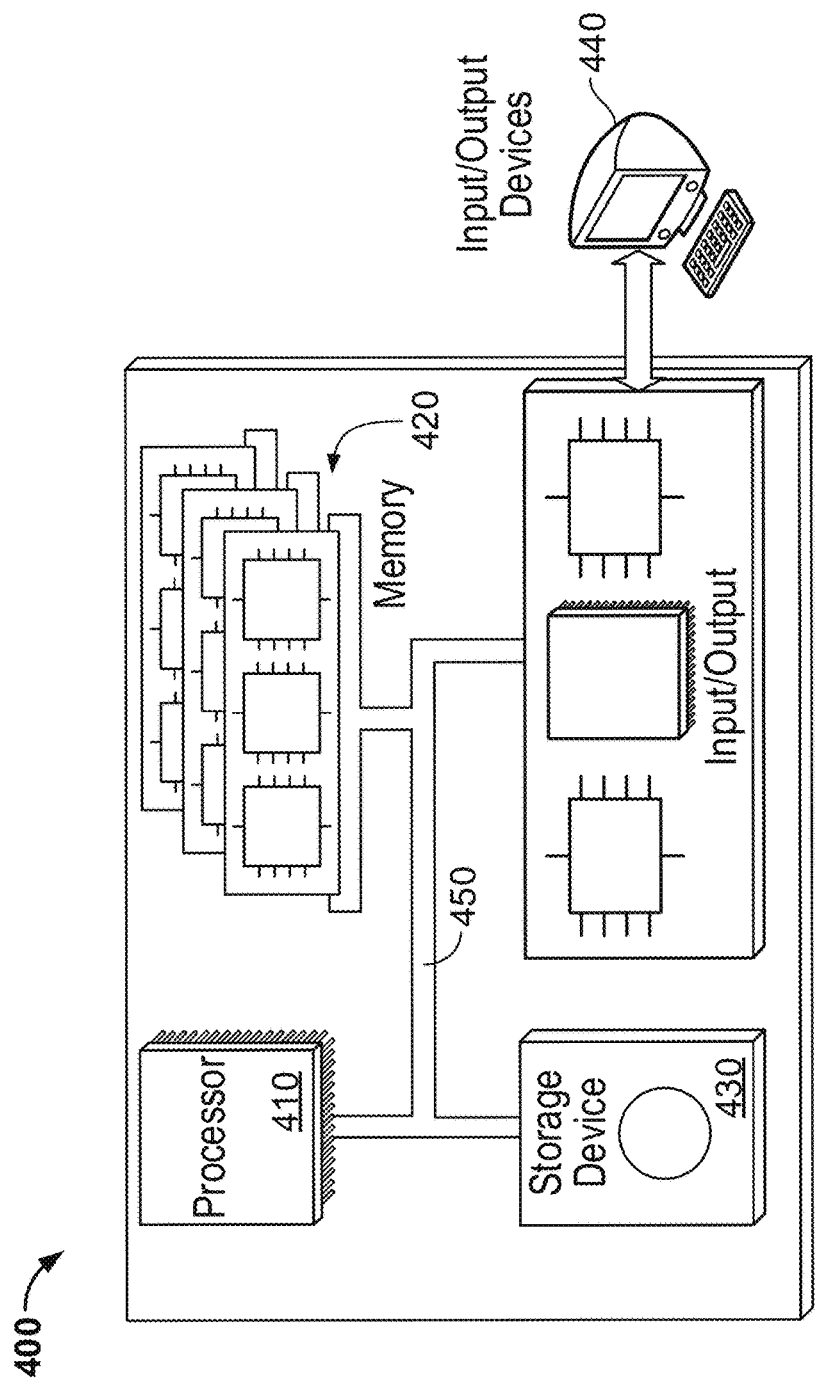
FIG. 4 is a schematic diagram of a computer system for performing operations according to the present disclosure.

FIG. 4 is a schematic diagram of a computer system 400. The system 400 can be used to carry out the operations described in association with any of the computer-implemented methods described previously, according to some implementations. In some implementations, computing systems and devices and the functional operations described in this specification can be implemented in digital electronic circuitry, in tangibly-embodied computer software or firmware, in computer hardware, including the structures disclosed in this specification (e.g., computing system 102) and their structural equivalents, or in combinations of one or more of them. The system 400 is intended to include various forms of digital computers, such as laptops, desktops, workstations, servers, blade servers, mainframes, and other appropriate computers. The system 400 can also include mobile devices, such as personal digital assistants, cellular telephones, smartphones, and other similar computing devices. Additionally, the system can include portable storage media, such as Universal Serial Bus (USB) flash drives. For example, the USB flash drives may store operating systems and other applications. The USB flash drives can include input/output components, such as a wireless transducer or USB connector that may be inserted into a USB port of another computing device.

The system 400 includes a processor 410, a memory 420, a storage device 430, and an input/output device 440. Each of the components 410, 420, 430, and 440 are interconnected using a system bus 450. The processor 410 is capable of processing instructions for execution within the system 400. The processor may be designed using any of a number of architectures. For example, the processor 410 may be a CISC (Complex Instruction Set Computers) processor, a RISC (Reduced Instruction Set Computer) processor, or a MISC (Minimal Instruction Set Computer) processor.

In one implementation, the processor 410 is a single-threaded processor. In another implementation, the processor 410 is a multi-threaded processor. The processor 410 is capable of processing instructions stored in the memory 420 or on the storage device 430 to display graphical information for a user interface on the input/output device 440.

The memory 420 stores information within the system 400. In one implementation, the memory 420 is a computer-readable medium. In one implementation, the memory 420 is a volatile memory unit. In another implementation, the memory 420 is a non-volatile memory unit.

The storage device 430 is capable of providing mass storage for the system 400. In one implementation, the storage device 430 is a computer-readable medium. In various different implementations, the storage device 430 may be a floppy disk device, a hard disk device, an optical disk device, or a tape device.

The input/output device 440 provides input/output operations for the system 400. In one implementation, the input/output device 440 includes a keyboard and/or pointing device. In another implementation, the input/output device 440 includes a display unit for displaying graphical user interfaces.

The features described can be implemented in digital electronic circuitry, in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system, including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example, semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits). The machine learning model can run on Graphic Processing Units (GPUs) or custom machine learning inference accelerator hardware.

To provide for interaction with a user, the features can be implemented on a computer having a display device such as a CRT (cathode ray tube) or LCD (liquid crystal display) monitor for displaying information to the user and a keyboard and a pointing device, such as a mouse or a trackball by which the user can provide input to the computer. Additionally, such activities can be implemented via touchscreen flat-panel displays and other appropriate mechanisms.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

The computer system can include clients and servers. A client and server are generally remote from each other and typically interact through a network, such as the described one. The relationship of client and server arises by virtue of computer programs running on the respective computers and having a client-server relationship to each other.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can, in some cases, be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The foregoing description is provided in the context of one or more particular implementations. Various modifications, alterations, and permutations of the disclosed implementations can be made without departing from scope of the disclosure. Thus, the present disclosure is not intended to be limited only to the described or illustrated implementations, but is to be accorded the widest scope consistent with the principles and features disclosed herein.

What is claimed is:

1. A method for generating a subsurface image comprising:
   detecting a transient event in an electrical power line at two or more predetermined locations in the electrical power line;
   detecting, at the two or more predetermined locations, an electrical signal induced in the power line by a return electromagnetic signal that is generated by eddy currents induced in the subsurface by the transient event; and
   processing the detected electrical signal and transient event to generate a subsurface image.

2. The method of claim 1, wherein the transient event is a naturally occurring event.

3. The method of claim 2, wherein the transient event is caused by at least one of:
   a lightning strike;
   a transformer failure;
   a circuit breaker operation; or
   an electrical load being energized or de-energized.

4. The method of claim 1, wherein the transient event is an artificially induced event.

5. The method of claim 4, wherein the transient event is caused by at least one of:
   an electrical load being energized or de-energized;
   an intentional breaker operation; or
   a transient caused by one or more generators.

6. The method of claim 1, wherein the transient event and electrical signal are detected by sensors connected to the electrical power line at the two or more predetermined locations.

7. The method of claim 6, wherein the sensors detect electrical parameters of the power line, the electrical parameters comprising voltage, current, time rate of change of voltage, and time rate of change of current.

8. The method of claim 6, comprising additional sensors installed on a mobile platform.

9. The method of claim 1, wherein processing the detected electrical signal and transient event comprises:
   providing the detected electrical signal and the detected transient event as input to a machine learning model to generate the subsurface image.

10. The method of claim 9, comprising:
    providing power line geometry and electrical topography as additional input to the machine learning model.

11. The method of claim 1, wherein the electrical power line is an above ground, single phase, AC power transmission line.

12. The method of claim 1, wherein the electrical power line is a three phase, AC power transmission line.

13. The method claim 1, wherein the electrical power line is an underground, AC power transmission line.

14. A non-transitory, computer readable storage medium storing instructions that, when executed by at least one processor, cause the at least one processor to perform operations comprising:
    identifying at least one electrical signal induced in a power line by a return electromagnetic signal that is generated by eddy currents induced in a terranean subsurface by a transient event in the power line, the transient event detected in the power line at two or more predetermined locations;
    processing the identified electrical signal and detected transient event; and
    generating a subsurface image based on the processed electrical signal and transient event.

15. The non-transitory, computer readable medium of claim 14, wherein the transient event is caused by at least one of:
    a lightning strike;
    a transformer failure;
    a circuit breaker operation; or
    an electrical load being energized or de-energized.

16. The non-transitory, computer readable medium of claim 14, wherein the transient event and electrical signal are detected by sensors connected to the electrical power line at the two or more predetermined locations.

17. The non-transitory, computer readable medium of claim 16, wherein the sensors detect electrical parameters of the power line, the electrical parameters comprising voltage, current, time rate of change of voltage, and time rate of change of current.

18. The non-transitory, computer readable medium of claim 14, wherein processing the detected electrical signal and transient event comprises:
providing the detected electrical signal and the detected transient event as input to a machine learning model to generate the subsurface image.

19. The non-transitory, computer readable medium of claim 18, comprising:
providing power line geometry and electrical topography as additional input to the machine learning model.

20. The non-transitory, computer readable medium of claim 14, wherein the power line is an above ground, single phase, AC power transmission line.

21. A system for generating a subsurface image comprising:
two or more sensors connected to an electrical power line, each particular sensor connected to the electrical power line at a unique predetermined location;
one or more processors;
one or more tangible, non-transitory media operably connectable to the one or processors and storing a machine learning model that, when executed, cause the one or more processors to perform operations comprising:
receiving, by the machine learning model, a transient event detected in the power line by the two or more sensors;
receiving, by the machine learning model, at least one electrical signal induced in a power line by a return electromagnetic signal that is generated by eddy currents induced in a terranean subsurface by the transient event;
processing, by the machine learning model the received transient event and electrical signal to generate a subsurface image.

22. The system of claim 21, wherein the transient event is caused by at least one of:
a lightning strike;
a transformer failure;
a circuit breaker operation; or
an electrical load being energized or de-energized.

23. The system of claim 21, wherein the sensors detect electrical parameters of the power line, the electrical parameters comprising voltage, current, time rate of change of voltage, and time rate of change of current.

24. The system of claim 21, wherein the machine learning model is further configured to receive:
power line geometry and electrical topography.

25. The system of claim 21, wherein the electrical power line is an above ground, single phase, AC power transmission line.

26. The system of claim 25, wherein the electrical power line carries AC power in a voltage range of 50 kV to 200 kV.

* * * * *